US012696613B2

(12) United States Patent
Yaguchi

(10) Patent No.: US 12,696,613 B2
(45) Date of Patent: Jul. 28, 2026

(54) LIGHT-EMITTING ELEMENT, DISPLAY DEVICE, AND METHOD FOR MANUFACTURING LIGHT-EMITTING ELEMENT

(71) Applicant: SHARP KABUSHIKI KAISHA, Sakai City (JP)

(72) Inventor: Yuma Yaguchi, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 418 days.

(21) Appl. No.: 18/574,692

(22) PCT Filed: Aug. 6, 2021

(86) PCT No.: PCT/JP2021/029249
§ 371 (c)(1),
(2) Date: Dec. 27, 2023

(87) PCT Pub. No.: WO2023/013013
PCT Pub. Date: Feb. 9, 2023

(65) Prior Publication Data

US 2025/0081716 A1 Mar. 6, 2025

(51) Int. Cl.

| | |
|---|---|
| ***H10K 50/11*** | (2023.01) |
| ***H10K 50/115*** | (2023.01) |
| ***H10K 50/155*** | (2023.01) |
| ***H10K 50/165*** | (2023.01) |
| ***H10K 59/35*** | (2023.01) |
| ***H10K 85/10*** | (2023.01) |
| *H10K 59/12* | (2023.01) |

(52) U.S. Cl.
CPC ......... *H10K 50/115* (2023.02); *H10K 50/155* (2023.02); *H10K 50/165* (2023.02); *H10K 59/35* (2023.02); *H10K 85/151* (2023.02); *H10K 59/1201* (2023.02)

(58) Field of Classification Search
CPC .. H10K 50/115; H10K 50/155; H10K 50/165; H10K 59/35; H10K 85/151; H10K 59/1201; H10K 50/11; G09F 9/30; H05B 33/10; H05B 33/14
See application file for complete search history.

(56) References Cited

U.S. PATENT DOCUMENTS

2013/0069036 A1* 3/2013 Miyata ................ C09K 11/025
438/35
2017/0256591 A1* 9/2017 Li ..................... G02F 1/133516
(Continued)

FOREIGN PATENT DOCUMENTS

WO 2012/128173 A1 9/2012
WO WO-2020208810 A1 * 10/2020 ............ H05B 33/14

*Primary Examiner* — S M Sohel Imtiaz
(74) *Attorney, Agent, or Firm* — ScienBiziP, P.C.

(57) ABSTRACT

A red light-emitting element according to the present disclosure includes a pixel electrode, a red light-emitting layer, and a common electrode in the stated order. The red light-emitting layer includes the following: a first red function region including red nanoparticles and first red ligands; and a second red function region including red nanoparticles and second red ligands different from the first red ligands, and being adjacent to at least a part of the side surface of the first red function region. The volume resistivity of the second red function region is higher than the volume resistivity of the first red function region.

20 Claims, 8 Drawing Sheets

(56) References Cited

U.S. PATENT DOCUMENTS

| | | | | |
|---|---|---|---|---|
| 2021/0043862 | A1* | 2/2021 | Hamilton | H10K 50/115 |
| 2023/0180496 | A1* | 6/2023 | Kanehiro | H10K 50/115<br>257/40 |
| 2023/0247848 | A1* | 8/2023 | Ryohwa | H10K 59/35<br>257/40 |
| 2024/0138172 | A1* | 4/2024 | Kimoto | H05B 33/10 |

* cited by examiner

LIGHT-EMITTING ELEMENT, DISPLAY DEVICE, AND METHOD FOR MANUFACTURING LIGHT-EMITTING ELEMENT

TECHNICAL FIELD

The present disclosure relates to a light-emitting element, a display device, and a method for manufacturing a light-emitting element.

BACKGROUND ART

Patent Literature 1 discloses a quantum-dot light-emitting diode (QLED), with the efficiency of carrier injection into quantum dots improved by filling an insulating material having excellent voltage resistance between the quantum dots.

CITATION LIST

Patent Literature

Patent Literature 1: International Publication No. WO2012/128173A1

SUMMARY

Technical Problem

Conventional QLEDs involve brightness unevenness that results from an electric-field concentration, a coffee ring effect, or other factors. Such a brightness unevenness problem has not been solved by the configuration disclosed in Patent Literature 1.

One aspect of the present disclosure aims to reduce brightness unevenness in the emission region of a light-emitting element.

Solution to Problem

To solve the above problem, a light-emitting element according to one aspect of the present disclosure includes a first electrode, a function layer, and a second electrode in the stated order. The function layer has the following: a first function region including a functional material and a first ligand; and a second function region including the functional material and a second ligand different from the first ligand, the second function region being adjacent to at least a part of the side surface of the first function region. The volume resistivity of the second function region is higher than the volume resistivity of the first function region.

To solve the above problem, a light-emitting element according to one aspect of the present disclosure includes a first electrode, a function layer, and a second electrode in the stated order. The function layer has the following: a first function region including a functional material and a first ligand; and a second function region including the functional material and a second ligand different from the first ligand, the second function region being adjacent to at least a part of the side surface of the first function region. The volume resistivity of a film composed of only the second ligand is higher than the volume resistivity of a film composed of only the first ligand.

To solve the above problem, a light-emitting element according to one aspect of the present disclosure includes a first electrode, a function layer, and a second electrode in the stated order. The function layer has the following: a first function region including a functional material and a first ligand; and a second function region including the functional material and a second ligand different from the first ligand, the second function region being adjacent to at least a part of the side surface of the first function region. Carbon contained in the second ligand outnumbers carbon contained in the first ligand by five or more.

To solve the above problem, a method for manufacturing a light-emitting element according to one aspect of the disclosure includes the following: a first-electrode formation step of forming a first electrode; a function-layer formation step of forming a function layer onto the first electrode; and a second-electrode formation step of forming a second electrode onto the function layer. The function-layer formation step includes the following: a functional-material-layer formation step of forming a functional-material layer that has a first function region that includes a functional material and a first ligand; a resist-layer formation step of forming a resist layer onto the functional-material layer; a photolithography step including an exposure step in which a part of the resist layer undergoes exposure, and a development step in which the resist layer undergoes development using a developing solution, wherein the photolithography step is performed to remove the part or other parts of the resist layer; and a second-function-region formation step of supplying, to a part of the functional-material layer, a replacement liquid containing a second ligand different from the first ligand, to form a second function region that includes the functional material and the second ligand, and that is adjacent to at least a part of the side surface of the first function region. The volume resistivity of the second function region is higher than the volume resistivity of the first function region.

To solve the above problem, a method for manufacturing a light-emitting element according to one aspect of the disclosure includes the following: a first-electrode formation step of forming a first electrode; a function-layer formation step of forming a function layer onto the first electrode; and a second-electrode formation step of forming a second electrode onto the function layer. The function-layer formation step includes the following: a functional-material-layer formation step of forming a functional-material layer that has a first function region that includes a functional material and a first ligand; a resist-layer formation step of forming a resist layer onto the functional-material layer; a photolithography step including an exposure step in which a part of the resist layer undergoes exposure, and a development step in which the resist layer undergoes development using a developing solution, wherein the photolithography step is performed to remove the part or other parts of the resist layer; and a second-function-region formation step of supplying, to a part of the functional-material layer, a replacement liquid containing a second ligand different from the first ligand, to form a second function region that includes the functional material and the second ligand, and that is adjacent to at least a part of the side surface of the first function region. The volume resistivity of a film composed of only the second ligand is higher than the volume resistivity of a film composed of only the first ligand.

To solve the above problem, a method for manufacturing a light-emitting element according to one aspect of the disclosure includes the following: a first-electrode formation step of forming a first electrode; a function-layer formation step of forming a function layer onto the first electrode; and a second-electrode formation step of forming a second electrode onto the function layer. The function-layer formation step includes the following: a functional-material-layer formation step of forming a functional-material layer that has a first function region that includes a functional material and a first ligand; a resist-layer formation step of forming a resist layer onto the functional-material layer; a photolithography step including an exposure step in which a part of the resist layer undergoes exposure, and a development step in which the resist layer undergoes development using a developing solution, wherein the photolithography step is performed to remove the part or other parts of the resist layer; and a second-function-region formation step of supplying, to a part of the functional-material layer, a replacement liquid containing a second ligand different from the first ligand, to form a second function region that includes the functional material and the second ligand, and that is adjacent to at least a part of the side surface of the first function region. Carbon contained in the second ligand outnumbers carbon contained in the first ligand by five or more.

Advantageous Effect of Invention

The aspects of the present disclosure can reduce brightness unevenness in the emission region of a light-emitting element.

DESCRIPTION OF EMBODIMENTS

In the present disclosure, a ligand means an atom, a molecule, or an ion that is capable of coordinating with a nanoparticle and encompasses an atom, a molecule, or an ion that is capable of coordinating with a nanoparticle, but is not coordinating with it in reality.

First Embodiment

Overview of Display Device

Figure 2:
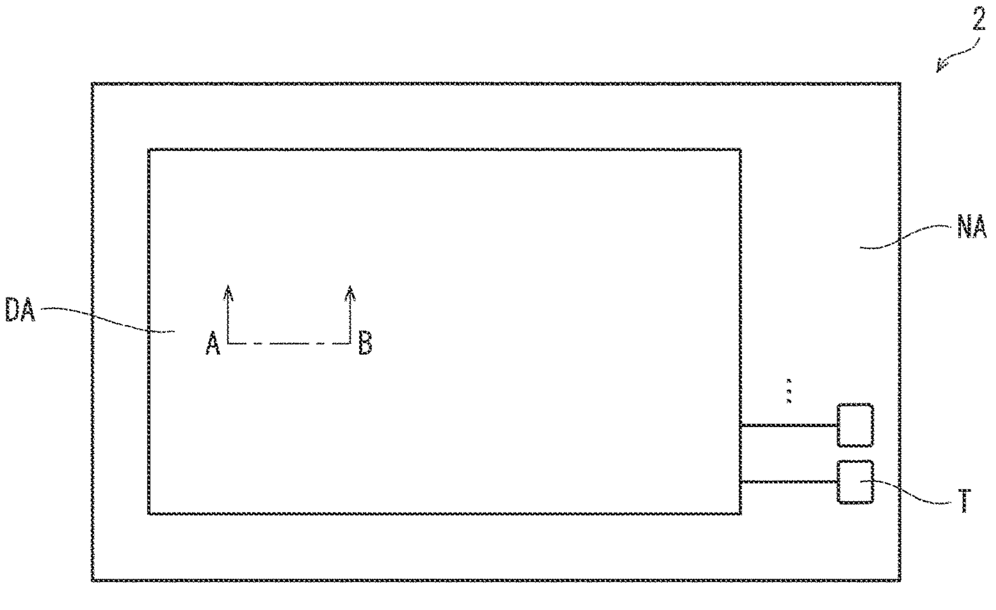
FIG. 2 is a schematic plan view of the display device according to the first embodiment.

FIG. 2 is a schematic plan view of a display device 2 according to this embodiment. As illustrated in FIG. 2, the display device 2 according to this embodiment has a display region DA where light emitted from each subpixel, which will be described later on, is taken out to thus perform display, and a frame region NA surrounding the display region DA. In the frame region NA is terminals T that receive a signal for driving the individual light-emitting elements of the display device 2.

Figure 1:
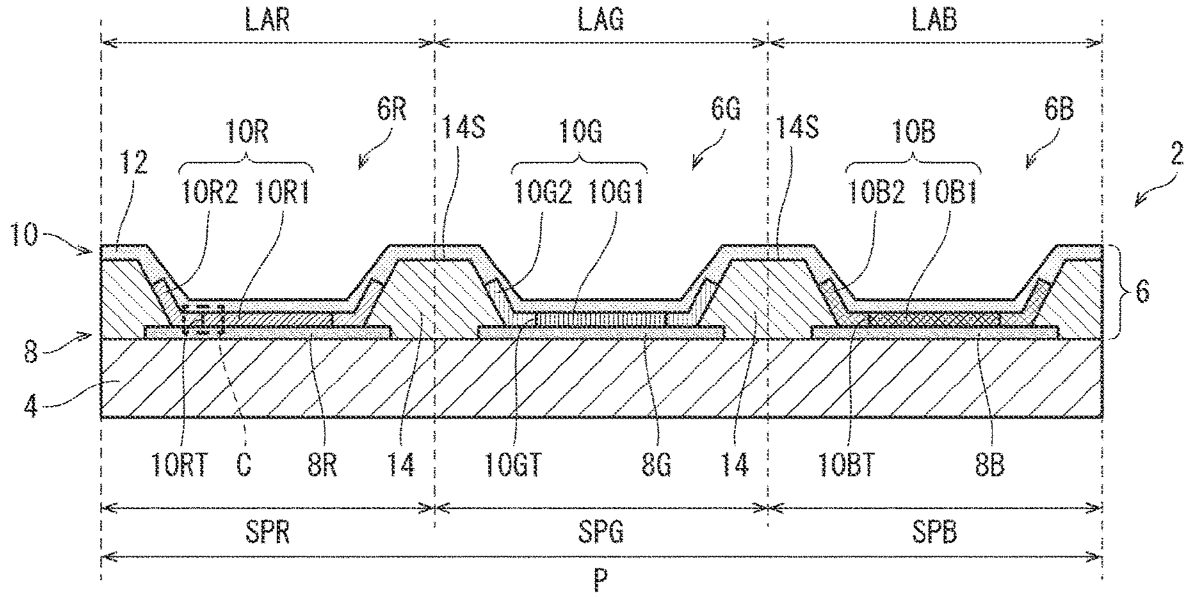
FIG. 1 is a schematic sectional view of a display device according to a first embodiment.

FIG. 1 is a schematic sectional view of the display device 2 according to this embodiment. The schematic sectional view of the display device 2 illustrated in FIG. 1 is a sectional view taken along line A-B in FIG. 2.

The display device 2 according to this embodiment includes a plurality of pixels in a location overlapping the display region DA in plan view. Further, each pixel includes a plurality of subpixels. Among the plurality of pixels included in the display device 2, a pixel P is shown in the schematic sectional view of the display device 2 illustrated in FIG. 1. The pixel P specifically includes a red subpixel SPR, a green subpixel SPG, and a blue subpixel SPB.

As illustrated in FIG. 1, the display device 2 according to this embodiment includes a light-emitting element layer 6 on a substrate 4. The display device 2 specifically has a stack of individual layers of the light-emitting element layer 6 on the substrate 4 with thin-film transistors (TFTs) not shown formed thereon. It is noted that the Description describes a direction from a light-emitting layer 10, which will be described later on, of the light-emitting element layer 6 toward a pixel electrode 8 (first electrode), which will be described later on, as a downward direction and describes a direction from the light-emitting layer 10 toward a common electrode 12 (second electrode), which will be described later on, as an upward direction.

Overview of Light-Emitting Element

The light-emitting element layer 6 includes the following sequentially from near the substrate 4: the first electrode, which is herein the pixel electrode 8; a light-emitting member, which is herein the light-emitting layer 10; and the second electrode, which is herein the common electrode 12. In other words, the light-emitting element layer 6 includes the light-emitting layer 10 (function layer) between the pixel electrode 8 and the common electrode 12. The pixel electrode 8 of the light-emitting element layer 6 formed over the substrate 4 is formed in the form of an island for each of the foregoing subpixels and is electrically connected to the respective TFTs on the substrate 4. It is noted that in the display device 2, a sealing layer, not shown, that seals the light-emitting element layer 6 may be provided over the light-emitting element layer 6.

The light-emitting element layer 6 in this embodiment includes a plurality of light-emitting elements; specifically, the light-emitting element layer 6 includes a single light-emitting element in each subpixel. For instance, the light-emitting element layer 6 in this embodiment has, as light-emitting elements, a red light-emitting element 6R in the red subpixel SPR, a green light-emitting element 6G in the green subpixel SPG, and a blue light-emitting element 6B in the blue subpixel SPB. Hereinafter, unless otherwise specified, a light-emitting element in the Description is any one of the red light-emitting element 6R, green light-emitting element 6G, and blue light-emitting element 6B included in the light-emitting element layer 6.

Here, each of the pixel electrode 8 and light-emitting layer 10 is individually formed for each subpixel. The pixel electrode 8 in this embodiment specifically includes a pixel electrode 8R for the red light-emitting element 6R, a pixel electrode 8G for the green light-emitting element 6G, and a pixel electrode 8B for the blue light-emitting element 6B. Further, the light-emitting layer 10 includes a red emission region LAR for the red light-emitting element 6R, a green emission region LAG for the green light-emitting element 6G, and a blue emission region LAB for the blue light-emitting element 6B. On the other hand, the common electrode 12 is formed throughout the plurality of subpixels in continuity.

As such, in this embodiment, the red light-emitting element 6R is composed of the pixel electrode 8R, the red emission region LAR, and the common electrode 12. Further, the green light-emitting element 6G is composed of the pixel electrode 8G, the green emission region LAG, and the common electrode 12. Furthermore, the blue light-emitting element 6B is composed of the pixel electrode 8B, the blue emission region LAB, and the common electrode 12.

In this embodiment, the red emission region LAR includes a red light-emitting layer (function layer) that emits red light as its main emission region, the green emission region LAG includes a green light-emitting layer 10G (function layer) that emits green light as its main emission region, and the blue emission region LAB includes a blue light-emitting layer 10B (function layer) that emits blue light as its main emission region. In other words, the red light-emitting element 6R, the green light-emitting element 6G, and the blue light-emitting element 6*b* are respectively a light-emitting element that emits red light, a light-emitting element that emits green light, and a light-emitting element that emits blue light. In furthermore other words, the light-emitting layer 10 includes a plurality kinds of emission regions for mutually different colors of emitted light: the red emission region LAR for red light emission, the green emission region LAG for green light emission, and the blue emission region LAB for blue light emission.

Here, blue light is light having an emission central wavelength within a wavelength band ranging, for instance, from 400 nm or greater to 500 nm or smaller. Further, green light is light having an emission central wavelength within a wavelength band ranging, for instance, from over 500 nm to 600 nm or smaller. Further, red light is light having an emission central wavelength within a wavelength band ranging, for instance, from over 600 nm to 780 nm or smaller.

Although not shown, the red emission region LAR may also optionally include a red perimeter region that is adjacent to at least a part of the side surface of the red light-emitting layer 10R, the green emission region LAG may also optionally include a green perimeter region that is adjacent to at least a part of the side surface of the green light-emitting layer 10G, and the blue emission region LAB may also optionally include a blue perimeter region that is adjacent to at least a part of the side surface of the blue light-emitting layer 10B. Each perimeter region does not normally emit light substantially. For easy description, the description and illustration about the perimeter regions will be hereinafter omitted.

It is noted that the light-emitting element layer 6 according to this embodiment is not limited the foregoing configuration; the light-emitting element layer 6 may further include an additional layer in a function layer between the pixel electrode 8 and common electrode 12. For instance, the light-emitting element layer 6 may further include at least one of a charge injection layer and a charge transport layer as a function layer between the pixel electrode 8 and the light-emitting layer 10 in addition to the light-emitting layer 10. Further, the light-emitting element layer 6 may further include at least one of a charge transport layer and a charge injection layer between the light-emitting layer 10 and the common electrode 12.

When the light-emitting element layer 6 includes, as a charge injection layer or a charge transport layer, any one function layer among a hole injection layer, a hole transport layer, an electron transport layer, and an electron injection, the charge injection layer or charge transport layer may have quantum dots. In this case, the quantum dot contained in the charge injection layer or charge transport layer each may have a structure of only a core. Further, the charge injection layer or charge transport layer may have nanoparticle semiconductors containing, but not limited to, ZnO, NiO, or CuO as nanoparticles. Furthermore, the quantum dots contained in the charge injection layer or charge transport layer each may coordinate with ligands.

The pixel electrode 8 and the common electrode 12 contain a conductive material and are electrically connected to the light-emitting layer 10. One of the pixel electrode 8 and common electrode 12 closer to the display surface of the display device 2 is a semi-transparent electrode.

The pixel electrode 8 has a stack of indium tin oxide (ITO) on an Ag—Pd—Cu alloy for instance. The pixel electrode 8 having this configuration is, for instance, a reflective electrode that reflects light emitted from the light-emitting layer 10. Thus, light emitted from the light-emitting layer 10 and moving in the downward direction is reflected by the pixel electrode 8.

In contrast to this, the common electrode 12 is composed of, for instance, semi-transparent Mg—Ag alloy. That is, the common electrode 12 is a transmissive electrode that transmits light emitted from the light-emitting layer 10. Thus, light emitted from the light-emitting layer 10 and moving in the upward direction passes through the common electrode 12. In this way, the display device 2 can upwardly radiate light emitted from the light-emitting layer 10.

As described above, the display device 2 enables both light emitted in the upward direction from the light-emitting layer 10 and light emitted in the downward direction from the light-emitting layer 10 to move to the common electrode 12 (in the upward direction). That is, the display device 2 is configured as a top-emission display device.

Further, the common electrode 12 in the this embodiment, which is a semi-transparent electrode, partly reflects light emitted from the light-emitting layer 10. In this case, a cavity of the light emitted from the light-emitting layer 10 may be formed between the pixel electrode 8, which is a reflective electrode, and the common electrode 12, which is a semi-transparent electrode. Forming a cavity between the pixel electrode 8 and the common electrode 12 can narrow the half-value breadth of the emission spectrum of the light emitted from the light-emitting layer 10, to thus widening a display color gamut and can enhance the luminance in the front direction, to thus improve the color gamut and brightness chromaticity of the display device.

It is noted that the foregoing configuration of the pixel electrode 8 and common electrode 12 is an example; they may have another configuration. For instance, an electrode closer to the display surface of the display device 2 may be the pixel electrode 8. In this case, the pixel electrode 8 may be a semi-transparent electrode, and the common electrode 12 may be a reflective electrode. Accordingly, the display device 2 enables both light emitted in the upward direction from the light-emitting layer 10, and light emitted in the downward direction from the light-emitting layer 10 to move to the pixel electrode 8 (in the downward direction). That is, the display device 2 may be configured as a bottom-emission display device.

The light-emitting layer 10 is a layer that emits light in response to recombination of a hole transported from the pixel electrode 8 and an electron transported from the common electrode 12. Materials and other things contained in the light-emitting layer 10 will be detailed later on.

It is noted that when the pixel electrode 8 is an anode, the common electrode 12 is a cathode. It is also noted that when the pixel electrode 8 is a cathode, the common electrode 12 is an anode.

The display device 2 according to this embodiment further includes banks 14 on the substrate 4. The banks 14 are formed in locations striding, in plan view, the boundaries between the subpixels adjacent to each other. The pixel electrode 8 is specifically separated into the pixel electrode 8R, pixel electrode 8G, and pixel electrode 8B by the banks 14. It is noted that the banks 14 may be formed in locations that cover the respective perimeter ends of the pixel electrode 8, as illustrated in FIG. 1.

Each of the banks 14 in this embodiment has an upper surface 14S near the common electrode 12. Here, each of the banks 14 in this embodiment is formed in such a manner that the upper surface 14S strides the boundary between the subpixels adjacent to each other. The bank 14 thus partitions the subpixels with mutually different colors of emitted light.

Light-Emitting Layer

The configuration of the light-emitting layer 10 will be described with reference to FIG. 1 and FIG. 3.

Figure 3:
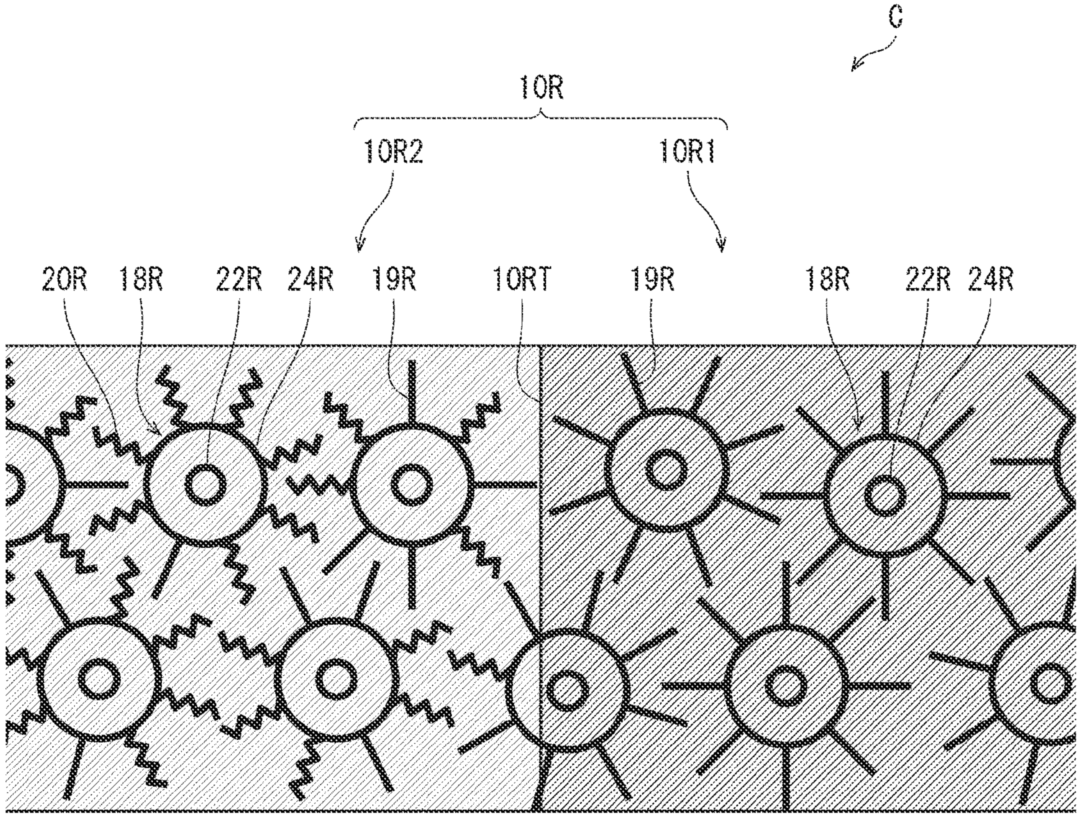
FIG. 3 is a partial enlarged sectional view of the display device according to the first embodiment.

FIG. 3 is a partial enlarged view of a region C illustrated in FIG. 1. The region C illustrated in FIG. 1 partly includes the boundary between a first red function region 10R1 of the red light-emitting layer 10R in FIG. 1 and a second red function region 10R2 of the same.

As illustrated in FIG. 1 and FIG. 3, the red light-emitting layer 10R has the first red function region 10R1 (first function region), and the second red function region 10R2 (second function region) adjacent to at least a part of a side surface 10RT of the first red function region 10R1.

The first red function region 10R1 includes a plurality of red nanoparticles 18R (functional materials), and first red ligands 19R (first ligands) capable of coordinating with each of the red nanoparticles 18R.

On the other hand, the second red function region 10R2 includes a plurality of red nanoparticles 18R, and second red ligands 20R (second ligands) capable of coordinating with each of the red nanoparticles 18R. The second red function region 10R2 may also include the first red ligands 19R optionally. Here, the second red ligands 20R are different from the first red ligands 19R.

The red nanoparticles 18R generate excitons upon injection of anode-derived holes and cathode-derived electrons to thus cause hole-and-electron recombination. Furthermore, the red nanoparticles 18R emit red light by being excited by the generated excitons.

Each of the red nanoparticles 18R has a structure typically called a core-shell type provided with, for instance, a core 22R and a shell 24R covering the core 22R. The electron-and-hole recombination and red-light generation in the red nanoparticle 18R occur in the core 22R mainly. The shell 24R has the function of preventing a defect, a dangling bond, or other things in the core 22R, and reducing carrier recombination through a deactivation process. In this case, the first red ligand 19R and the second red ligand 20R coordinate on the outer surface of the shell 24R.

With regard to electrical conduction, the volume resistivity of the second red function region 10R2 is higher than the volume resistivity of the first red function region 10R1. This volume resistivity difference increases a first current of current that flows between the pixel electrode 8 and common electrode 12 of the red light-emitting element 6R, and the difference reduces a second current of the same. Here, the first current passes through the first red function region, and the second current passes through the second red function region 10R2. Hence, the emission luminance of the second red function region 10R2 is lower than the emission luminance of the first red function region 10R1 when the other conditions are the same.

In a known light-emitting element, the light-emitting layer exhibits a uniform ligand distribution. In other words, the volume resistivity of the red light-emitting layer of a known red light-emitting element is uniform. For this reason, the known light-emitting element unfortunately involves nonuniformity in the emission luminance distribution (so-called brightness unevenness) in the emission region of the light-emitting element due to various factors, including an electric-field concentration, a coffee ring effect, and a surface tension.

In contrast to this, the red light-emitting element 6R according to the present disclosure can raise the emission luminance of the first red function region 10R1 and can lower the emission luminance of the second red function region 10R2, as earlier described. This can cancel out brightness unevenness. Thus, the red light-emitting element 6R according to the present disclosure exerts the effect of reducing brightness unevenness further than a red light-emitting element having the known configuration.

To reduce brightness unevenness, the volume resistivity of the second red function region 10R2 is preferably higher than the volume resistivity of the first red function region 10R1 by 2 to 1000 times inclusive.

For brightness unevenness in a known light-emitting element, the emission luminance in the middle of its main emission region is typically low, and the emission luminance around the periphery of the same is typically high. Hence, to cancel out brightness unevenness to make emission luminance more uniform, the first red function region 10R1 preferably corresponds to the middle of the red light-emitting layer 10R, and the second red function region 10R2 preferably corresponds to the peripheral region surrounding the middle of the red light-emitting layer 10R.

As illustrated in FIG. 1, the green light-emitting layer 10G has a first green function region 10G1 (first function region), and a second green function region 10G2 (second function region) adjacent to at least a part of a side surface 10GT of the first green function region.

The first green function region 10G1 includes a plurality of green nanoparticles (functional materials), and first green ligands (first ligands) capable of coordinating with each of the green nanoparticles 18G. On the other hand, the second green function region 10G2 includes a plurality of green nanoparticles, and second green ligands (second ligands) capable of coordinating with each of the green nanoparticles 18G. The second green function region 10G2 may also include the first green ligands optionally. Here, the second green ligands are different from the first green ligands. The green nanoparticles emit green light upon being excited by injection of anode-derived holes and cathode-derived electrons, and their recombination.

With regard to electrical conduction, the volume resistivity of the second green function region 10G2 is higher than the volume resistivity of the first green function region 10G1. Thus, the green light-emitting element 6G according to the present disclosure exerts an effect similar to that of the foregoing red light-emitting element 6R according to the present disclosure, and the configuration suitable for the red light-emitting element 6R is suitable for the green light-emitting element 6G as well.

As illustrated in FIG. 1, the blue light-emitting layer 10B has a first blue function region OB1 (first function region), and a second blue function region 10B2 (second function region) adjacent to at least a part of a side surface 10BT of the first blue function region.

The first blue function region 10B1 includes a plurality of blue nanoparticles (functional materials), and first blue ligands (first ligands) capable of coordinating with each of the blue nanoparticles 18B. On the other hand, the second blue function region 10B2 includes a plurality of blue nanoparticles, and second blue ligands (second ligands) capable of coordinating with each of the blue nanoparticles 18B. The second blue function region 10B2 may also include the first blue ligands optionally. Here, the second blue ligands are different from the first blue ligands. The blue nanoparticles emit blue light upon being excited by injection of anode-derived holes and cathode-derived electrons, and their recombination.

With regard to electrical conduction, the volume resistivity of the second blue function region 10B2 is higher than the volume resistivity of the first blue function region 10B1. Thus, the blue light-emitting element 6B according to the present disclosure exerts an effect similar to that of the foregoing red light-emitting element 6R according to the present disclosure, and the configuration suitable for the red light-emitting element 6R is suitable for the blue light-emitting element 6B as well.

Ligands

The following describes the foregoing ligands.

Both of each first red ligand 19R and each second red ligand 20R are insulating materials with excellent voltage resistance; on the other hand, their electrical properties are different. The second red ligand 20R is less likely to allow current to flow than the first red ligand 19R. That is, the volume resistivity of a film composed of only the second red ligands 20R is higher than the volume resistivity of a film composed of the first red ligands 19R.

Hence, the volume resistivity of the second red function region 10R2 including the second red ligands 20R is higher than the volume resistivity of the first red function region 10R1 including no second red ligands 20R.

To reduce brightness unevenness, the volume resistivity of the film composed of only the second red ligands 20R is preferably higher than the volume resistivity of the film composed of the first red ligands 19R by 2 to 1000 times inclusive. This is because that in the known technique, where the volume resistivity of a light-emitting layer exhibits a uniform distribution, a current that flows through the peripheral region around the light-emitting layer is typically larger than a current that flows through the middle of the light-emitting layer by 2 to 1000 times inclusive due to nonuniformity in applied voltage and nonuniformity in film thickness.

To achieve such a volume resistivity difference, carbon contained in the second red ligand 20R preferably outnumbers carbon contained in the first red ligand 19R by five or more. A carbon-containing insulating material commonly tends to inhibit the movement of electric charges along with increase in the number of carbon atoms. Hence, the volume resistivity of the second red function region 10R2 including the second red ligands 20R is higher than the volume resistivity of the first red function region 10R1 including no second red ligands 20R.

To reduce brightness unevenness, the second red ligand 20R preferably contains 10 to 30 carbon atoms inclusive. At this time, the first red ligand 19R preferably contains less carbon than carbon contained in the second red ligand 20R by five or more and preferably contains 1 to 25 carbon atoms inclusive.

Further, the second red ligands 20R preferably include a long-chain ligand containing 10 or more carbon atoms. The long-chain ligand containing 10 or more carbon atoms has a long chain that functions as electrical resistance, thus inhibiting the movement of electric charges.

This can reduce an electric-field concentration. In addition, the volume resistivity of the second red function region 10R2 can be easily regulated by regulating the number of carbon atoms of the long chain. This is suitable for a reduction in brightness unevenness.

Examples of a long-chain ligand that is suitable for the second red ligands 20R include thiols, such as 1-hexadecanethiol and eicosanthiol, fatty acids, such as palmitic acid and heneicosanoic acid, and amines, such as hexadecylamine.

It is specifically preferable that the long-chain ligand included in the second red ligands 20R contain 10 to 30 carbon atoms inclusive in its main-chain skeleton and/or contain 2 to 20 carbon atoms inclusive in its side-chain skeleton. The main-chain skeleton and the side-chain skeleton each function as electrical resistance, thus inhibiting the movement of electric charges. This can reduce an electric-field concentration. In addition, the volume resistivity of the second red function region 10R2 can be easily regulated by regulating the number of carbon atoms of each of the main-chain skeleton and side-chain skeleton. This is suitable for a reduction in brightness unevenness.

The second red ligands 20R also preferably include an oligomer ligand containing an oligomer. The oligomer ligand has a molecular weight of 1000 or greater and less than 10000.

The second red ligands 20R also preferably include a polymer ligand containing a polymer. The polymer ligand has a molecular weight of 10000 or greater. The oligomer ligand and the polymer ligand both inhibit the movement of electric charges; by regulating their polymerization amounts, the volume resistivity of the second red function region 10R2 can be regulated easily. A polymer- or oligomer-containing insulating material commonly tends to inhibit the movement of electric charges along with increase in the number of polymerization reactions.

Furthermore, some polymer ligands exert the effect of avoiding permeation of water and oxygen. Thus, to protect the first red function region 10R1 of the red light-emitting layer 10R, it is particularly preferable that the second red ligands 20R include a polymer ligand that exerts this effect.

Examples of the polymer ligand that exerts the effect of avoiding the permeation of water and oxygen include thiols, such as Thiokol and 8-ArmPEG-SH (also referred to as 8-ArmPEG-Thiol), and amines, such as polyethyleneimine. One of various kinds of Thiokol is expressed by Structural Formula (1) below; 8-ArmPEG-SH, by Structural Formula (2) below; and one of various kinds of polyethyleneimine, by Structural Formula (3) below.

[Chemical 1]

(1)

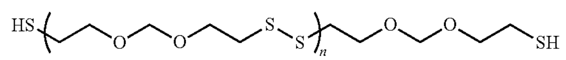

[Chemical 2]

(2)

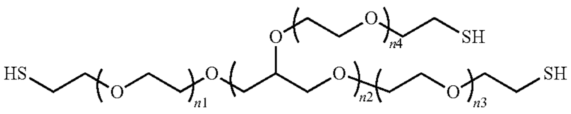

[Chemical 3]

(3)

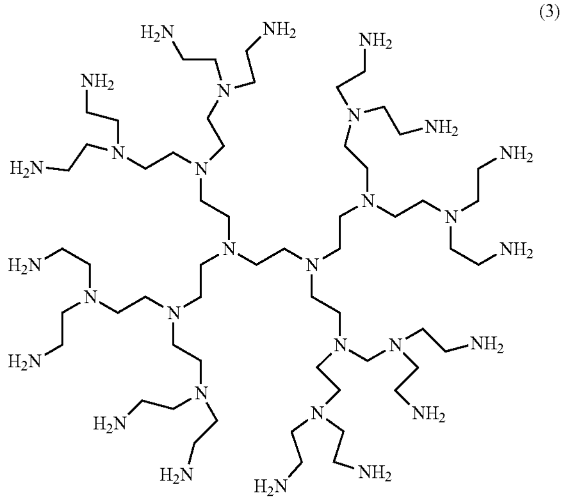

Here, n, $n_1$, $n_2$, $n_3$, and $n_4$ each independently denote a natural number. Further, SH and HS denote a thiol group, and $NH_2$ and $H_2N$ denote an amino group. Further, N denotes a nitrogen atom, and O denotes an oxygen atom.

Alternatively, to achieve the foregoing volume resistivity difference, the first red ligand 19R may contain a conductive functional group that contributes to an improvement in electrical conductivity. On the other hand, the second red ligand 20R does not preferably contain a conductive functional group. Examples of such a conductive functional group include a phenyl group, a thiophene group, a fluorene group, a triphenylamine group, a carbazole group, a pyridine group, a pyrimidine group, and a triazole group.

To coordinate with the red nanoparticles 18R, the first red ligands 19R and the second red ligands 20R each preferably contain a coordinating functional group capable of coordinating with the red nanoparticles 18R. Examples of such a coordinating functional group include at least one from the group consisting of a thiol (—SH) group, an amino (—$NR_2$) group, a carboxyl (—C(═O)OH) group, a phosphon (—P(═O)$(OR)_2$) group, a phosphine (—$PR_2$) group, a phosphine oxide (—P(═O)$R_2$) group, and a hydroxyl group (—OH).

Here, R each independently denotes a hydrogen atom or any organic group, such as an alkyl group, an aryl group, an alkoxyl group, or an unsaturated hydrocarbon group.

In other words, the long-chain ligand included in the second red ligands 20R preferably contains at least one selected from the group consisting of the following: a thiol-based organic material and its derivative; an amine-based organic material and its derivative; a carboxyl-group-based organic material and its derivative; a phosphon-based organic material and its derivative; a phosphine-based organic material and its derivative; a phosphine-oxide-based organic material and its derivative; and a hydroxyl-group-based organic material and its derivative. Further, the oligomer ligand included in the second red ligands 20R preferably contains at least one selected from the group consisting of the following: a thiol-based oligomer and its derivative; an amine-based oligomer and its derivative; a carboxyl-group-based oligomer and its derivative; a phosphon-based oligomer and its derivative; a phosphine-based oligomer and its derivative; a phosphine-oxide-based oligomer and its derivative; and a hydroxyl-group oligomer and its derivative. Further, the polymer ligand included in the second red ligands 20R preferably contains at least one selected from the group consisting of the following: a thiol-based polymer and its derivative; an amine-based polymer and its derivative; a carboxyl-group-based polymer and its derivative; a phosphon-based polymer and its derivative; a phosphine-based polymer and its derivative; a phosphine-oxide-based polymer and its derivative; and a hydroxyl-group polymer and its derivative.

It is particularly preferable that the first red ligands 19R and the second red ligands 20R each contain, as a coordinating functional group, at least one from the group consisting of a tertiary phosphon group, a tertiary phosphine group, and a tertiary phosphine oxide group.

The foregoing description about the first red ligands 19R and second red ligands 20R of the red light-emitting layer 10R is applicable to the first green ligands and second green ligands of the green light-emitting layer 10G, and to the first blue ligands and second blue ligands of the blue light-emitting layer 10B.

The first red ligand 19R, the first green ligand, and the first blue ligand may be different from or identical to each other.

Likewise, the second red ligand 20R, the second green ligand, and the second blue ligand may be different from or identical to each other. Further, the second red ligand 20R, the second green ligand, and the second blue ligand may be selected as appropriate so as to be suitable for the canceling-out of brightness unevenness in the individual red light-emitting element 6R, green light-emitting element 6G, and blue light-emitting element 6B.

Overview of Method for Manufacturing Display Device

A method for manufacturing the display device 2 according to this embodiment will be described with reference to FIG. 4 to FIG. 13.

Figure 4:
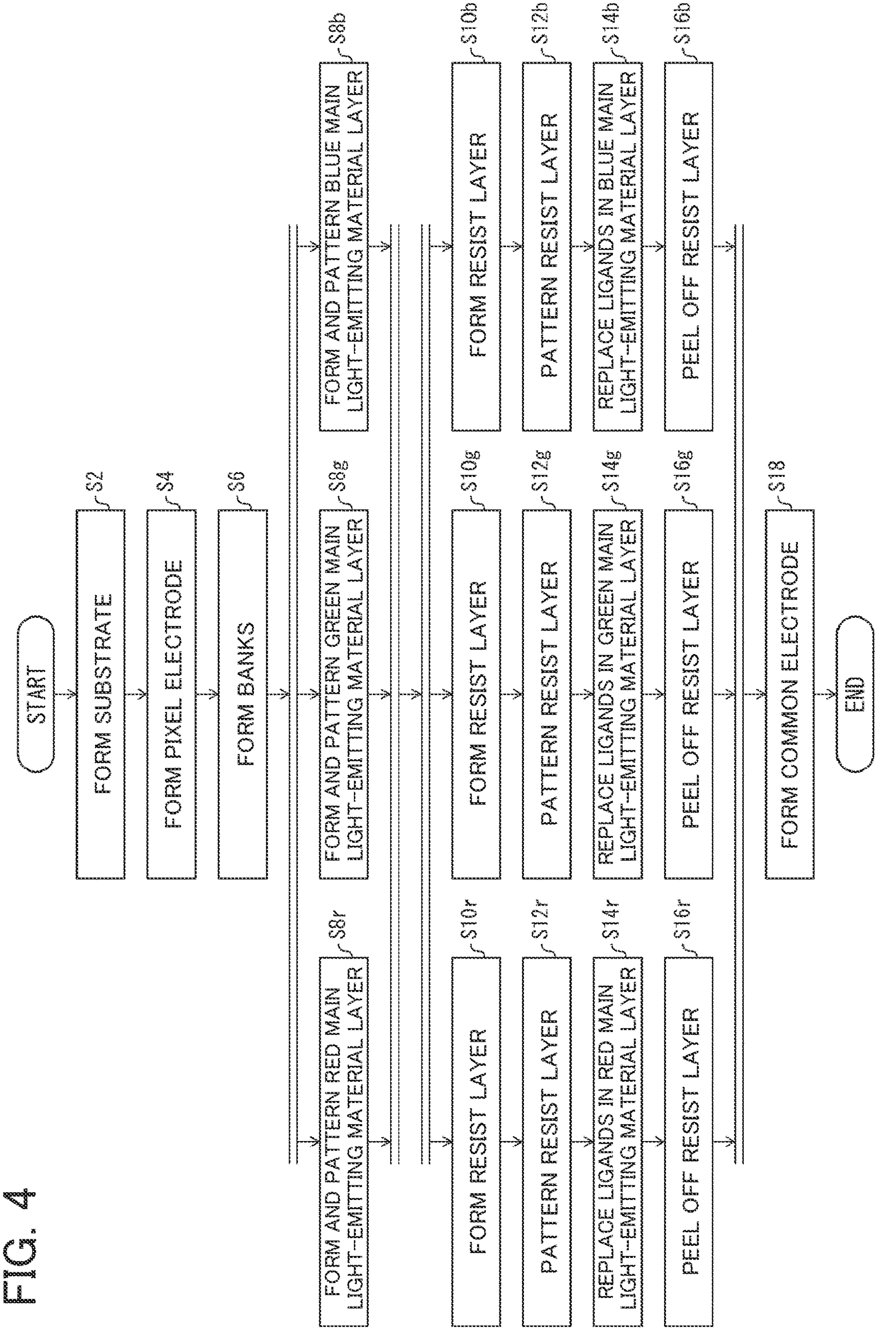
FIG. 4 is a flowchart showing an example method for manufacturing the display device according to the first embodiment.

FIG. 4 is a flowchart schematically showing an example method for manufacturing the display device 2 according to this embodiment. FIG. 5 to FIG. 13 are sectional views of the display device 2 according to this embodiment in the process of being manufactured.

Unless otherwise specified, the sectional views in the Description are sectional views in a location corresponding to the cross section of the display device 2 illustrated in FIG. 1.

As shown in FIG. 4, in the method for manufacturing the display device 2 according to this embodiment, the first process step (Step S2) is forming the substrate 4. The substrate 4 may be formed by forming TFTs onto a glass substrate in correspondence with locations for forming the individual subpixels of the display device 2.

The next (Step S4, a first-electrode formation step) is forming the pixel electrode 8. The pixel electrode 8 may be formed by, for instance, forming films of a conductive material simultaneously for the subpixels through sputtering or other processing, followed by patterning this thin film of the conductive material for each subpixel, as described above.

The next (Step S6) is forming the banks 14. The banks 14 may be formed by, for instance, applying a resin material containing a photosensitive material onto the substrate 4 and pixel electrode 8, followed by patterning the resin material through photolithography.

Figure 5:
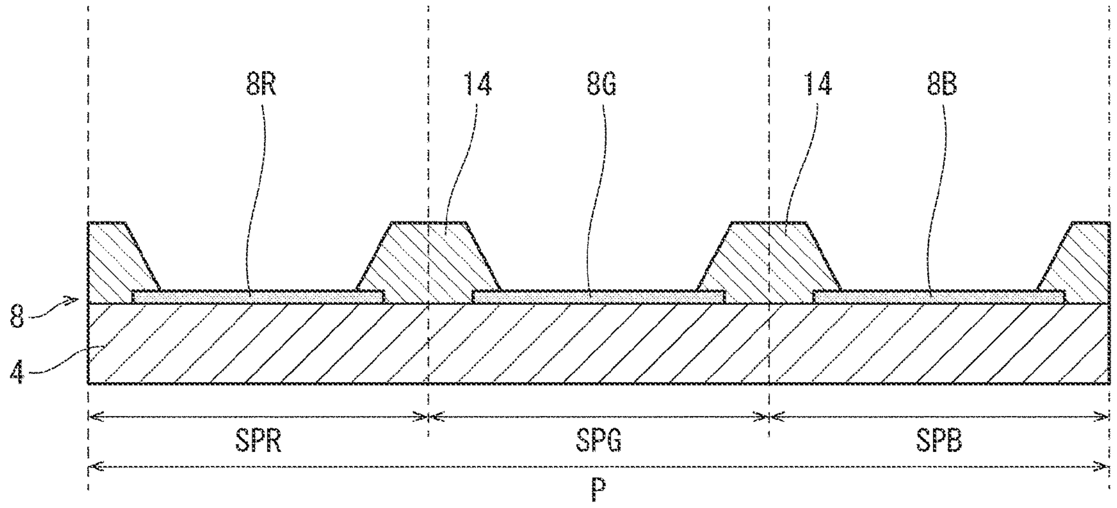
FIG. 5 is a sectional view of the display device according to the first embodiment in the process of being manufactured.
Figure 6:
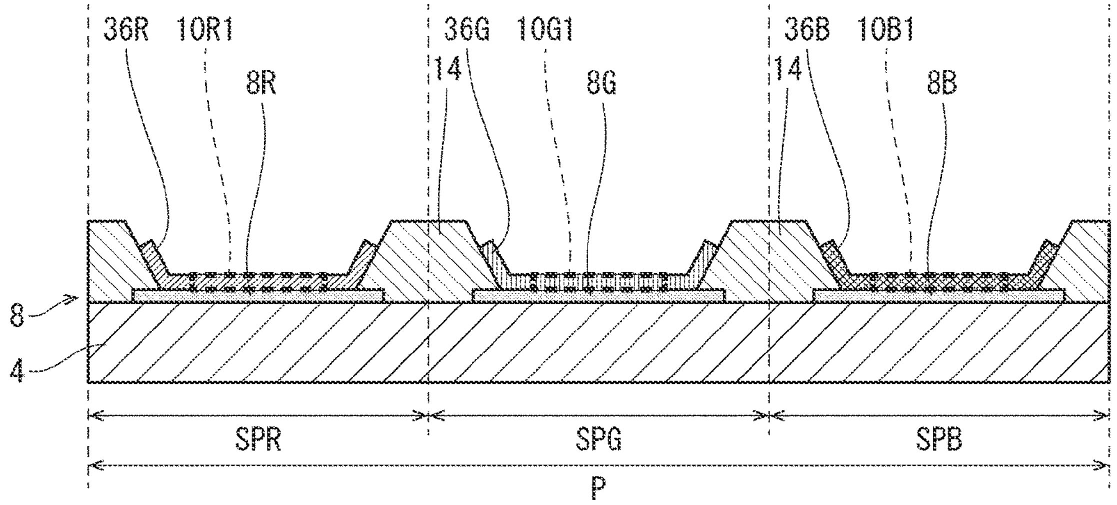
FIG. 6 is a sectional view of the display device according to the first embodiment in the process of being manufactured.

By performing the individual process steps through Step S6, a structure with the pixel electrode 8 and banks 14 formed is formed on the substrate 4, as illustrated in FIG. 5. It is noted that the pixel electrode 8 includes the following island-shaped pixel electrodes formed by patterning the conductive material for each subpixel: the pixel electrode 8R in the red subpixel SPR, the pixel electrode 8G in the green subpixel SPG, and the pixel electrode 8B in the blue subpixel SPB. It is also noted that the banks 14 are formed in locations covering the boundaries between the subpixels, and covering the peripheral ends of the individual pixel electrodes 8.

Formation of Light-Emitting Layer and Patterning

The next process steps are the following through a known technique: forming a red main light-emitting material layer 36R (functional-material layer), and patterning (Step S8*r*); forming a green main light-emitting material layer 36G (functional-material layer), and patterning (Step S8*g*); and forming a blue main light-emitting material layer 36B (functional-material layer), and patterning (Step S8*b*). The known technique here is a manufacturing method where the volume resistivity of a light-emitting layer exhibits a uniform distribution.

In Step S8*r*, the red main light-emitting material layer 36R includes the red nanoparticles 18R and the first red ligands 19R, but includes no second red ligands 20R. Further, the red main light-emitting material layer 36R undergoes patterning so as to include the first red function region 10R1, and a portion that is to constitute the second red function region 10R2 in a posterior process step, which will be described later on. The portion that is to constitute the second red function region 10R2 is adjacent to the side surface 10RT of the first red function 10R1.

Likewise, in Step S8*g*, the green main light-emitting material layer 36G includes the green nanoparticles 18G and the first green ligands 19G, but includes no second green ligands 20G. Further, the green main light-emitting material layer 36G undergoes patterning so as to include the first green function region 10G1, and a portion that is to constitute the second green function region 10G2 in a posterior process step, which will be described later on.

Likewise, in Step S8*b*, the blue main light-emitting material layer 36B includes the blue nanoparticles 18B and the first blue ligands 19B, but includes no second blue ligands 20B. Further, the blue main light-emitting material layer 36B undergoes patterning so as to include the first blue function region 10B1, and a portion that is to constitute the second blue function region 10B2 in a posterior process step, which will be described later on.

The order of executing Step S8*r*, Step S8*g*, and Step S8*b* is optional. Further, the method of forming and patterning each of the red main light-emitting material layer 36R, green main light-emitting material layer 36G, and blue main light-emitting material layer 36B is optional.

Each of the red main light-emitting material layer 36R, green main light-emitting material layer 36G, and blue main light-emitting material layer 36B may be formed and patterned through a method using photolithography.

A usable example of the method using photolithography may be so-called etching. To be specific, this process step (a functional-material-layer formation step) is forming the red main light-emitting material layer 36R across the plurality of subpixels by applying or spraying a solution containing a solvent, the red nanoparticles 18R, and the first red ligands 19R, followed by evaporating the solvent from the solution. The following (a resist-layer formation step) is forming a resist layer containing a photoresist onto the red main light-emitting material layer 36R, followed by photolithography in which the resist layer undergoes exposure and development, followed by etching the red main light-emitting material layer 36R using the resist layer as a mask, followed by removing the resist layer.

Another usable example of the method using photolithography may be so-called liftoff. To be specific, this process step is forming a resist layer containing a photoresist across the plurality of subpixels, followed by photolithography in which the resist layer undergoes exposure and development, followed by forming the red main light-emitting material layer 36R across the plurality of subpixels, followed by removing the resist layer. As the result of the resist layer removal, the portion of the red main light-emitting material layer 36R formed on the resist layer falls off to be thus removed.

Further another usable example of the method using photolithography may be so-called a QD-PR method. To be specific, this process step is forming the red main light-emitting material layer 36R across the plurality of subpixels by applying or spraying a solution containing a solvent, a photoresist, the red nanoparticles 18R, and the first red ligands 19R, followed by evaporating the solvent from the solution. Then, photolithography is performed in which the red main light-emitting material layer 36R undergoes exposure and development.

Alternatively, each light-emitting material layer may be formed and patterned through a different technique, such as printing including so-called ink-jet printing, or evaporation.

Ligand Replacement

Figure 7:
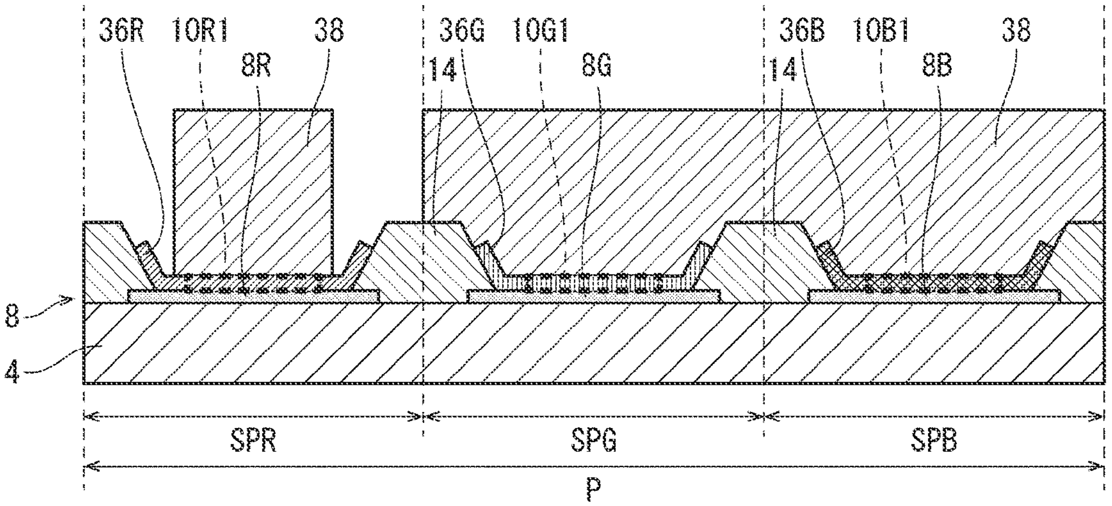
FIG. 7 is a sectional view of the display device according to the first embodiment in the process of being manufactured.

As illustrated in FIG. 7, the next (Step S10*r*) is forming a first resist layer 38 onto the red main light-emitting material layer 36R, green main light-emitting material layer 36G, and blue main light-emitting material layer 36B, followed by patterning the first resist layer 38 (Step S12*r*).

The first resist layer 38 according to this embodiment contains a photosensitive resin material. The first resist layer 38 is specifically a positive photoresist where its solubility in a particular developing solution improves in response to, for instance, ultraviolet irradiation. The first resist layer 38 dissolves in an alkaline solvent in response to, for instance, ultraviolet irradiation. The first resist layer 38 is formed by, for instance, applying a solution containing a photosensitive resin material onto the red main light-emitting material layer 36R.

Further, the first resist layer 38 may be soluble in a particular solvent irrespective of with or without exposure. For instance, the first resist layer 38 may be soluble in propyleneglycol monomethylether acetate (PGMEA) and N-methylpyrrolidone (NMP). In addition, the first resist layer 38 may be a negative photoresist that obtains insolubility in a particular developing solution in response to ultraviolet irradiation.

In Step S12*r*, a first photolithography step is executed, for instance, in order to remove a part of the first resist layer 38. The first photolithography step includes a first exposure step in which the first resist layer 38 partly undergoes exposure, and a first development step in which the first resist layer 38 undergoes development using a developing solution. In the first photolithography step, the first resist layer 38, when composed of a positive resist, is removed in the exposed part, and the first resist layer 38, when composed of a negative resist, is removed in all but the exposed part. The first photolithography step may be executed through, for instance, photolithography including irradiating only part of the first resist layer 38 with ultraviolet rays using a photomask, followed by rinsing the first resist layer 38 using a particular developing solution.

In Step S12*r*, the first resist layer 38 undergoes patterning so as to cover the first red function region 10R1 of the red main light-emitting material layer 36R as well as its vicinity, the entire green main light-emitting material layer 36G, and the entire blue main light-emitting material layer 36B, and to expose, from the first resist layer 38 except the vicinity of the first red function region 10R1, a portion of the red main light-emitting material layer 36R that is to constitute the second red function region 10R2 in a posterior process step.

Figure 8:
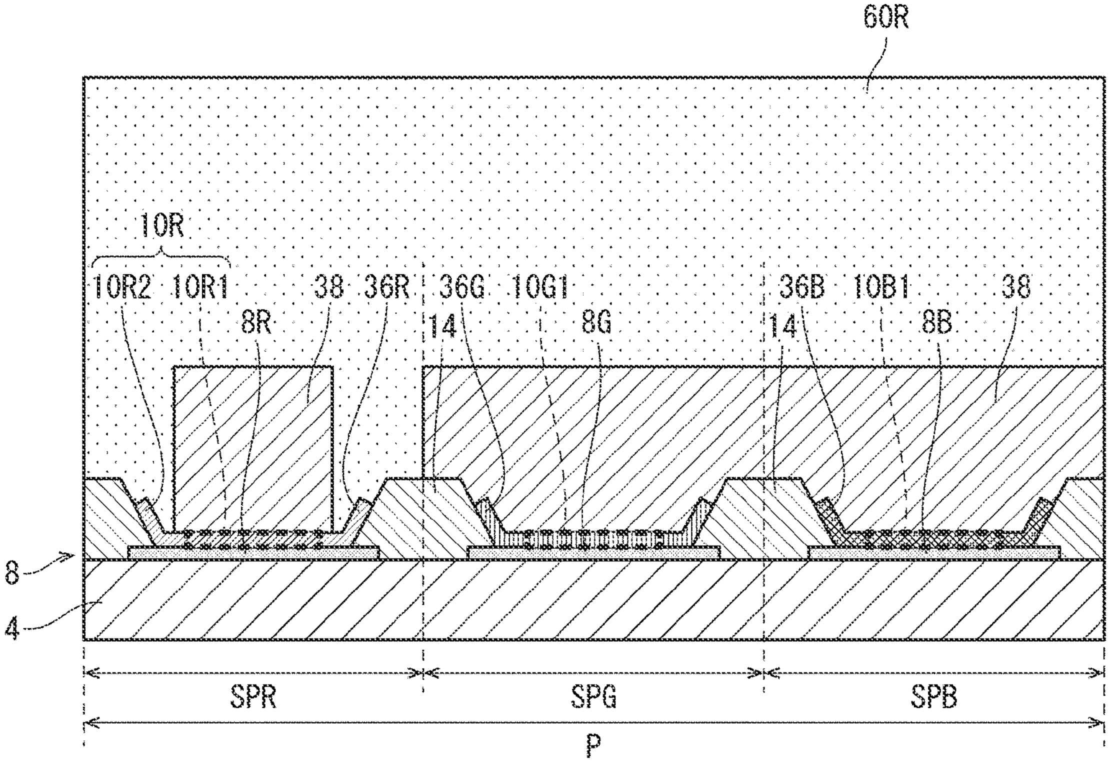
FIG. 8 is a sectional view of the display device according to the first embodiment in the process of being manufactured.

As illustrated in FIG. 8, the next (Step S14*r*) is performing a first replacement step of partially or completely replacing the first red ligands 19R with the second red ligands 20R in a part of the red main light-emitting material layer 36R.

The first replacement step is executed by, for instance, adjusting a first replacement liquid 60R with the second red ligands 20R added to a solvent in which the second red ligands 20R are soluble, and supplying the first replacement liquid 60R to the red main light-emitting material layer 36R. Then, after the elapse of a predetermined time period, the first replacement liquid 60R is removed, and the replacement is stopped. In addition, the second red ligands 20R remaining without coordinating with the red nanoparticles 18R may optionally undergo rinse using a solvent to be removed.

In this rinse, a solvent in which the second red ligands 20R remaining non-coordinating with the red nanoparticles 18R are soluble, and in which the red nanoparticle quantum dots 18R coordinating with the second red ligands 20R are insoluble is preferably used in order to avoid wet etching. For instance, oleic acid, which constitutes a typical hydrophobic ligand, dissolves in a wide variety of solvents ranging from an ethanol-containing polar solvent to a toluene-containing non-polar solvent when it remains non-coordinating. On the other hand, a nanoparticle coordinating with oleic acid does not dissolve in a polar solvent and dissolves in only a non-polar solvent. This is because that the polar part of the carboxyl group (—COOH) contained in oleic acid is used in coordination with a nanoparticle. As such, a non-polar solvent is preferably used in rinse when oleic acid is used as the second red ligands 20R.

In the Description, the wording "partially replace the first ligands in a part with the second ligands" means replacing some of the first ligands included in this part with the second ligands. On the other hand, the wording "completely replace the first ligands in a part with the second ligands" means replacing all of the first ligands included in this part with the second ligands.

As the result of the first replacement step, the first replacement liquid 60R permeates from the surface exposed from the first resist layer 38 through the portion of the red main light-emitting material layer 36R that is to constitute the second red function region 10R2 in this process step, and in this portion, the first red ligands 19R are replaced with the second red ligands 20R. As a result, the first red function region 10R1 remains, and this portion of the red main light-emitting material layer 36R (adjacent to the side surface 10RT of the first red function region 10R1) is formed as the second red function region 10R2.

The next (Step S16*r*) is peeling off the remaining first resist layer 38. For instance, when the first resist layer 38 is a positive photoresist where its solubility in a particular developing solution improves in response to ultraviolet irradiation, the first resist layer 38 may be peeled off by irradiating the first resist layer 38 with ultraviolet rays, followed by developing the first resist layer 38 using this developing solution. Alternatively, for instance, when the first resist layer 38 is soluble in a PEGMA-containing organic solvent irrespective of with or without exposure, the first resist layer 38 may be peeled off by rinsing the first resist layer 38 using this organic solvent.

Figure 9:
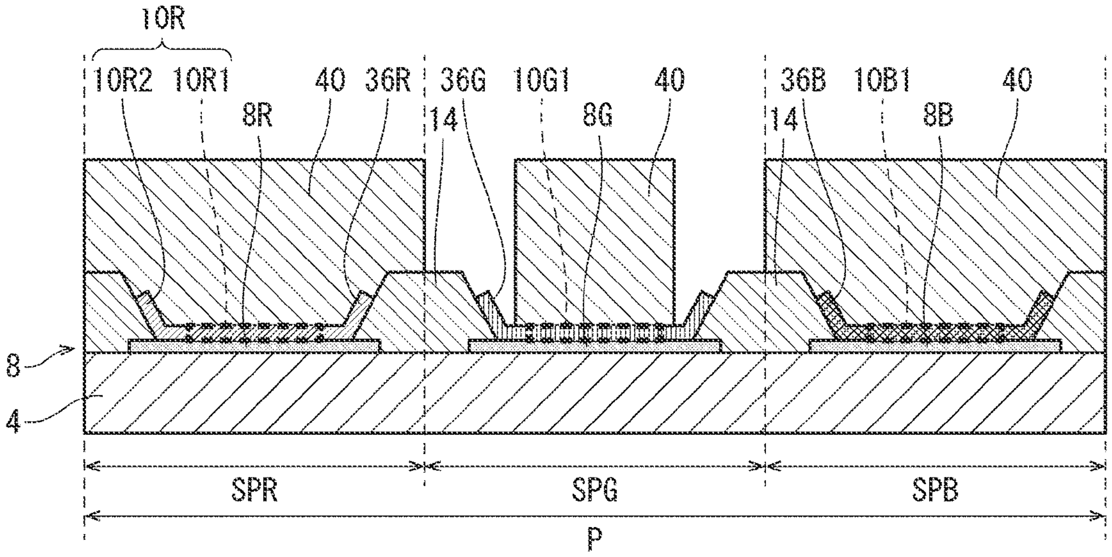
FIG. 9 is a sectional view of the display device according to the first embodiment in the process of being manufactured.

As illustrated in FIG. 9, the next (Step S10*g*) is forming a second resist layer 40 onto the red main light-emitting material layer 36R, green main light-emitting material layer 36G, and blue main light-emitting material layer 36B, followed by patterning the second resist layer 40 (Step S12*g*).

The second resist layer 40 according to this embodiment may have the same configuration as that of the first resist layer 38. Further, the second resist layer 40 may be formed through the same technique as that in Step S11.

In Step S12*g*, a second photolithography step is executed, for instance, in order to remove a part of the second resist layer 40. The second photolithography step includes a second exposure step in which the second resist layer 40 partly undergoes exposure, and a second development step in which the second resist layer 40 undergoes development using a developing solution. The second photolithography step may be executed by subjecting the second resist layer 40 to photolithography through the same technique as that in the first photolithography step.

In Step S12*g*, the second resist layer 40 undergoes patterning so as to cover the entire red main light-emitting material layer 36R, the first green function region 10G1 of the green main light-emitting material layer 36G as well as its vicinity, and the entire blue main light-emitting material layer 36B, and to expose, from the second resist layer 40 except the vicinity of the first green function region 10G1, a portion of the green main light-emitting material layer 36G that is to constitute the second green function region 10G2 in a posterior process step.

Figure 10:
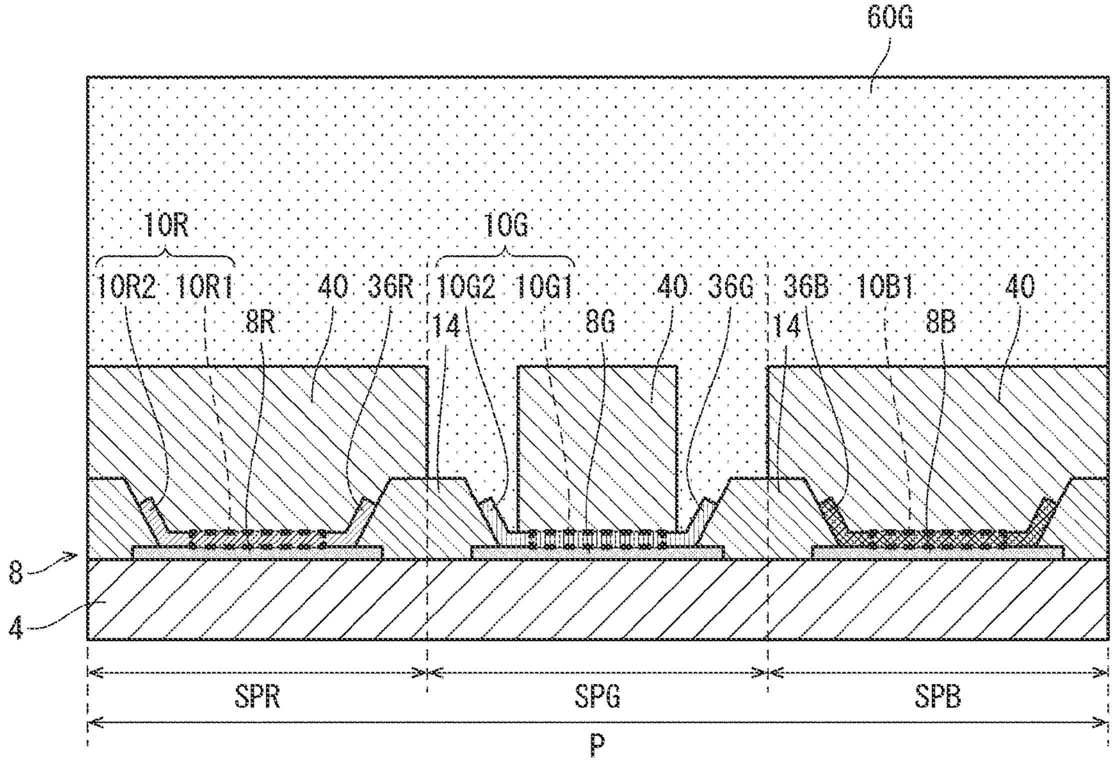
FIG. 10 is a sectional view of the display device according to the first embodiment in the process of being manufactured.

As illustrated in FIG. 10, the next (Step S14*g*) is a second replacement step of partially or completely replacing the first green ligands with the second green ligands in a part of the green main light-emitting material layer 36G.

The second replacement step is executed by, for instance, adjusting a second replacement liquid 60G with the second green ligands added to a solvent in which the second green ligands are soluble, and supplying the second replacement liquid 60G to the green main light-emitting material layer 36G. Then, after the elapse of a predetermined time period, the second replacement liquid 60G is removed, and the replacement is stopped. In addition, the second green ligands remaining without coordinating with the green nanoparticles may optionally undergo rinse using a solvent to be removed. In this rinse, a solvent in which the second green ligands remaining non-coordinating with the green nanoparticles are soluble, and in which the green nanoparticle quantum dots coordinating with the second green ligands are insoluble is preferably used in order to avoid wet etching.

As the result of the second replacement step, like that in the first replacement step, the first green function region 10G1 remains, and the portion of the green main light-emitting material layer 36G (adjacent to the side surface

10GT of the first green function region 10G1) is formed as the second green function region 10G2.

The next (Step S16*g*) is peeling off the remaining second resist layer 40. The second resist layer 40 may be peeled off through the same technique as that in the peeling-off of the first resist layer 38.

Figure 11:
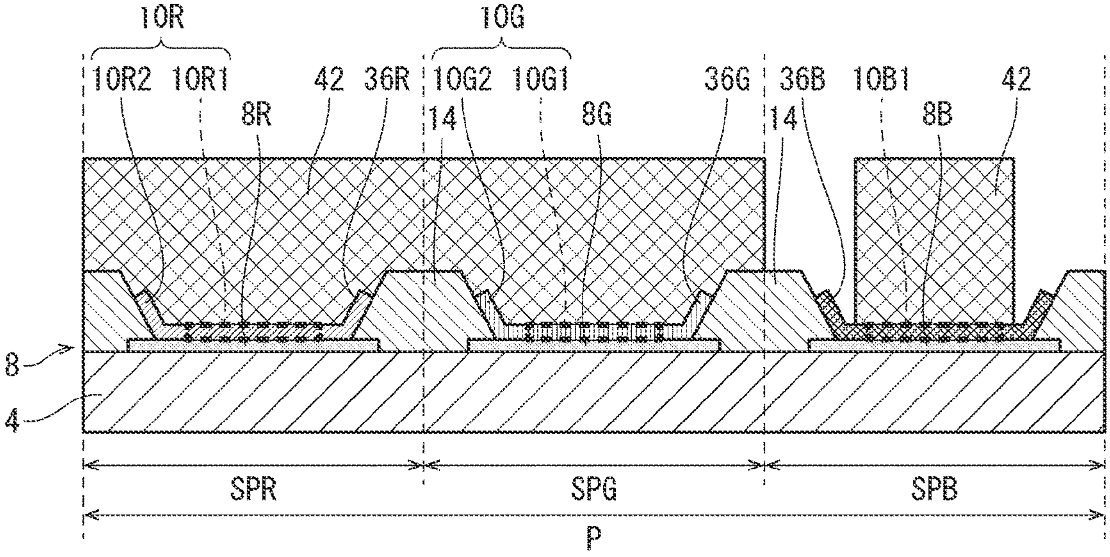
FIG. 11 is a sectional view of the display device according to the first embodiment in the process of being manufactured.

As illustrated in FIG. 11, the next (Step S10*b*) is forming a third resist layer 42 onto the red main light-emitting material layer 36R, green main light-emitting material layer 36G, and blue main light-emitting material layer 36B, followed by patterning the third resist layer 42 (Step S12*b*).

The third resist layer 42 according to this embodiment may have the same configuration as that of the first resist layer 38. Further, the third resist layer 42 may be formed through the same technique as that in Step S11.

In Step S12*b*, a third photolithography step is executed, for instance, in order to remove a part of the third resist layer 42. The third photolithography step includes a third exposure step in which the third resist layer 42 partly undergoes exposure, and a third development step in which the third resist layer 42 undergoes development using a developing solution. The third photolithography step may be executed by subjecting the third resist layer 42 to photolithography through the same technique as that in the first photolithography step.

In Step S12*b*, the third resist layer 42 undergoes patterning so as to cover the entire red main light-emitting material layer 36R, the entire green main light-emitting material layer 36G, and the first blue function region 10B1 of the blue main light-emitting material layer 36B as well as its vicinity, and to expose, from the third resist layer 42 except the vicinity of the first blue function region 10B1, a portion of the blue main light-emitting material layer 36B that is to constitute the second blue function region 10B2 in a posterior process step.

Figure 12:
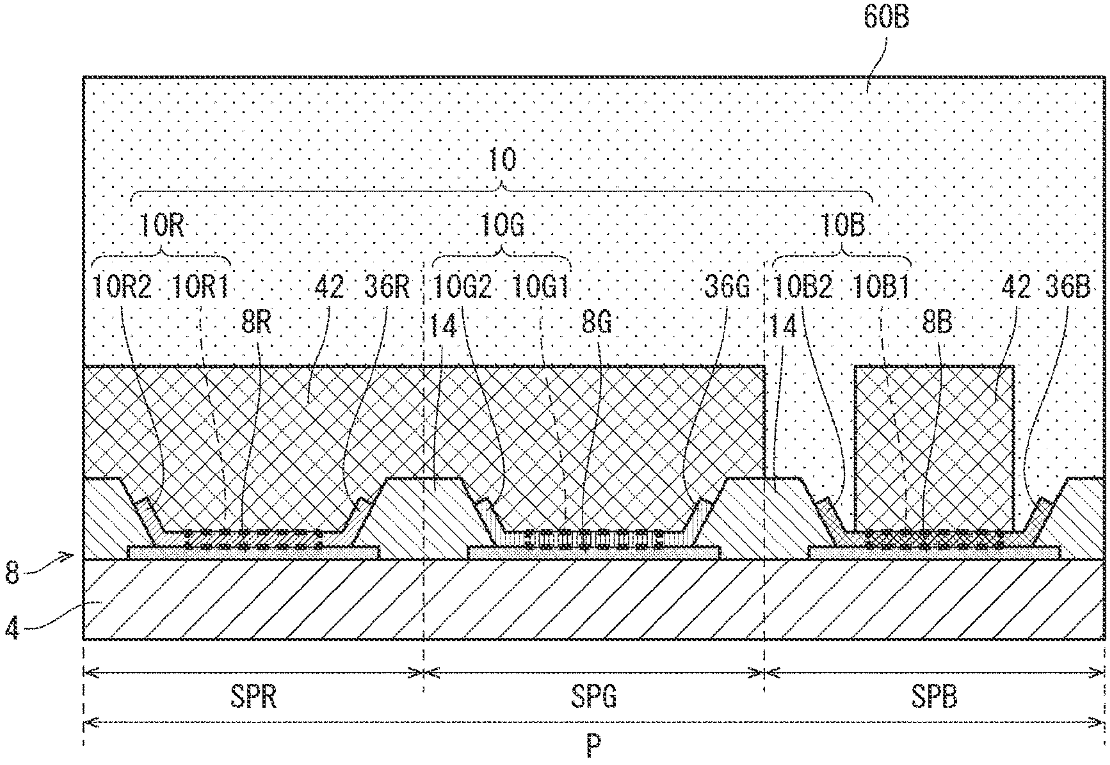
FIG. 12 is a sectional view of the display device according to the first embodiment in the process of being manufactured.

As illustrated in FIG. 12, the next (Step S14*b*) is a third replacement step of partially or completely replacing the first blue ligands with the second blue ligands in a part of the blue main light-emitting material layer 36B.

The third replacement step is executed by, for instance, adjusting a third replacement liquid 60B with the second blue ligands added to a solvent in which the second blue ligands are soluble, and supplying the third replacement liquid 60B to the blue main light-emitting material layer 36B. Then, after the elapse of a predetermined time period, the third replacement liquid 60B is removed, and the replacement is stopped. In addition, the second blue ligands remaining without coordinating with the blue nanoparticles may optionally undergo rinse using a solvent to be removed. In this rinse, a solvent in which the second blue ligands remaining non-coordinating with the blue nanoparticles are soluble, and in which the blue nanoparticle quantum dots coordinating with the second blue ligands are insoluble is preferably used in order to avoid wet etching.

As the result of the third replacement step, like that in the first replacement step, the first blue function region 10B1 remains, and the portion of the blue main light-emitting material layer 36B (adjacent to the side surface 10BT of the first blue function region 10B1) is formed as the second blue function region 10B2.

The next (Step S16*b*) is peeling off the remaining third resist layer 42. The third resist layer 42 may be peeled off through the same technique as that in the peeling-off of the first resist layer 38.

Figure 13:
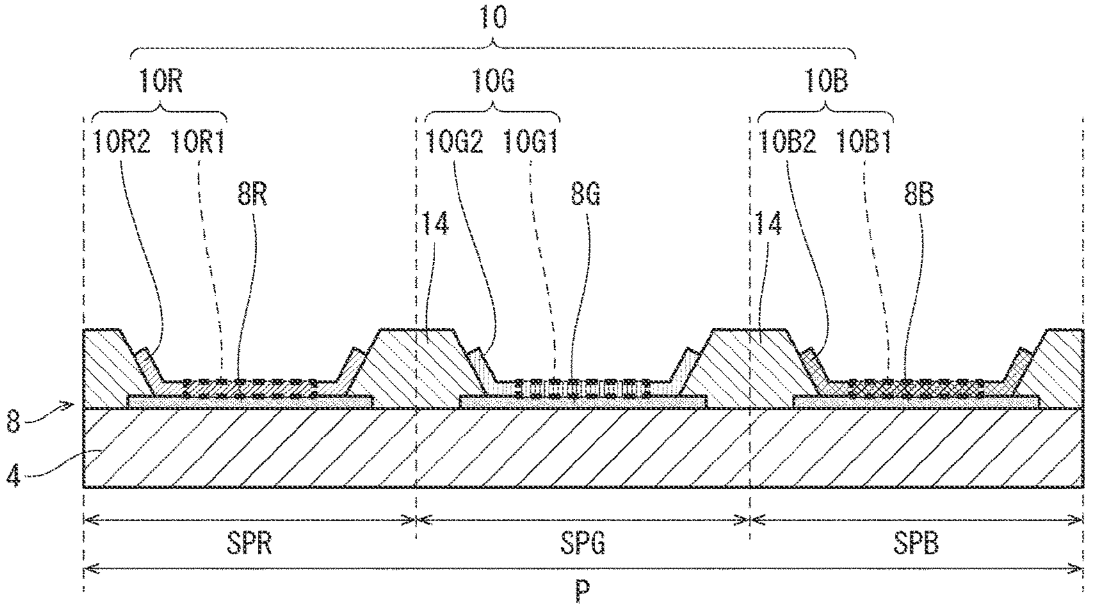
FIG. 13 is a sectional view of the display device according to the first embodiment in the process of being manufactured.

As described above, in one example of this embodiment, the structure illustrated in FIG. 13 is obtained at the time point when a series of process steps from Step S10*r* to Step S16*r*, a series of process steps from Step S1*g* to Step S16*g*, and a series of process steps from Step S10*b* to Step S16*b* are complete. It is noted that the order of executing the series of process steps from Step S10*r* to Step S16*r*, the series of process steps from Step S1*g* to Step S16*g*, and the series of process steps from Step S10*b* to Step S16*b* can be changed optionally.

Formation of Common Electrode

The next (Step S18, a second-electrode formation step) is forming the common electrode 12 that is shared among the plurality of subpixels, over the light-emitting layer 10, and accordingly, the formation of the light-emitting element layer 6 is completed. The common electrode 12 may be formed through the same technique as that for forming the film of the conductive material in the step of forming the pixel electrode 8. It is noted that in the method for manufacturing the display device 2 according to this embodiment, a sealing layer may be formed over the light-emitting element layer 6 after the step of forming the light-emitting element layer 6. Through the foregoing process steps, the display device 2 according to this embodiment is manufactured.

Modification

The method for manufacturing the display device 2 according to this embodiment can be modified in various manners.

For instance, a different main light-emitting material layer may be formed after the formation of the main light-emitting material layers, and after the ligand replacement in the main light-emitting material layers.

Further, for instance, the resist layers that are used for patterning the main light-emitting material layers may be also used for the ligand replacement in the main light-emitting material layers or a different main light-emitting material layer. These modifications save resist materials and reduces the number of manufacturing process steps.

Further, for instance, the formation of the main light-emitting material layers, the ligand replacement in the main light-emitting material layers, and the patterning of the main light-emitting material layers may be performed in the stated order.

Further, for instance, the ligand replacement in the main light-emitting material layers, and the etching of the main light-emitting material layers may be performed with a single liquid. Further, for instance, the development of the resist layers that are used for the ligand replacement in the main light-emitting material layers, and the etching of the main light-emitting material layers may be performed with a single liquid. Further, for instance, the development of the resist layers that are used for the ligand replacement in the main light-emitting material layers, the ligand replacement in the main light-emitting material layers, and the etching of the main light-emitting material layers may be performed with a single liquid. These modifications reduce the number of manufacturing process steps.

Further, for instance, Step S14*r*, Step S14*g*, and Step S14*b* may be performed simultaneously using a single replacement liquid when the second red ligands 20R, the second green ligands, and the second blue ligands are made of the same material. In this case, the resist layers are formed and patterned so as to cover the first red function region 10R1 of the red main light-emitting material layer 36R as well as its vicinity, the first green function region 10G1 of the green main light-emitting material layer 36G as well as its vicinity, and the first blue function region 10B1 of the blue main light-emitting material layer 36B as well as its vicinity, to expose, from the corresponding resist layer except the vicinity of the first red function region 10R1, the portion of the red main light-emitting material layer 36R that is to constitute the second red function region 10R2 in a posterior process step, to expose, from the corresponding resist layer except the vicinity of the first green function region 10G1, the portion of the green main light-emitting material layer 36G that is to constitute the second green function region 10G2 in a posterior process step, and to expose, from the corresponding resist layer except the vicinity of the first blue function region 10B1, the portion of the blue main light-emitting material layer 36B that is to constitute the second blue function region 10B2 in a posterior process step. This modification saves resist materials and reduces the number of manufacturing process steps.

Second Embodiment

The display device 2 according to this embodiment has the same configuration as that of the display device 2 according to the first embodiment with the exceptions of a first charge transport layer 56 and a second charge transport layer 58. The display device 2 according to this embodiment will be described with reference to FIG. 14.

Figure 14:
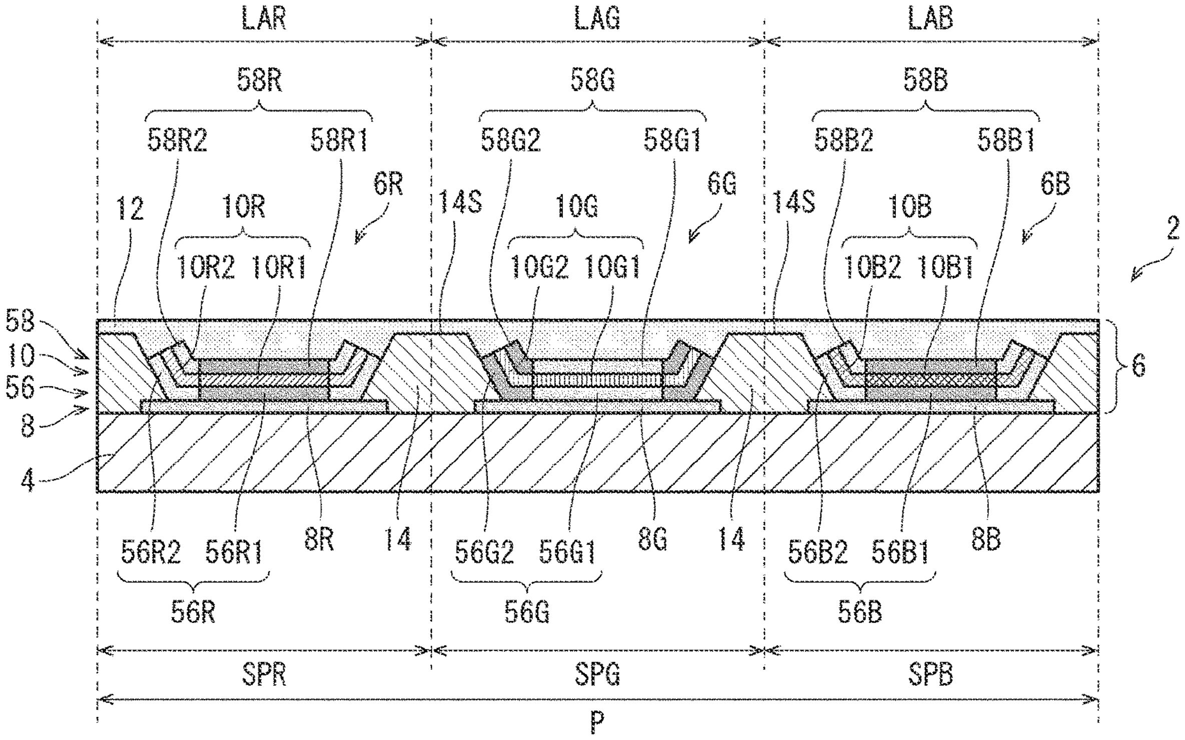
FIG. 14 is a schematic sectional view of a display device according to a second embodiment.

FIG. 14 is a schematic sectional view of the display device 2 according to this embodiment. The schematic sectional view of the display device 2 illustrated in FIG. 14 corresponds to the sectional view taken along line A-B in FIG. 2.

As illustrated in FIG. 14, the light-emitting element layer 6 according to this embodiment is different from the light-emitting element layer 6 according to the first embodiment in that the light-emitting element layer 6 according to this embodiment includes the following: the first charge transport layer 56 (function layer) provided between the pixel electrode 8 and the light-emitting layer 10; and the second charge transport layer 58 (function layer) provided between the common electrode 12 and the light-emitting layer 10. It is noted that in the display device 2, a sealing layer, not shown, that seals the light-emitting element layer 6 may be provided over the light-emitting element layer 6.

Here, each of the first charge transport layer 56 and second charge transport layer 58 is formed individually for each subpixel or is shared among the subpixels. The first charge transport layer 56 in this embodiment specifically includes a first red charge transport layer 56R for the red light-emitting element 6R, a first green charge transport layer 56G for the green light-emitting element 6G, and a first blue charge transport layer 56B for the blue light-emitting element 6B. Further, the second charge transport layer 58 includes a second red charge transport layer 58R for the red light-emitting element 6R, a second green charge transport layer 58G for the green light-emitting element 6G, and a second blue charge transport layer 58B for the blue light-emitting element 6B.

One of the first charge transport layer 56 and second charge transport layer 58 is a hole transport layer and includes, as functional materials, nanoparticles having hole transportability. An example of the nanoparticles having hole transportability is nanoparticle semiconductors containing NiO, CuO, or other things. The other of the first charge transport layer 56 and second charge transport layer 58 is an electron transport layer and includes, as functional materials, nanoparticles having electron transportability. An example of the nanoparticles having electron transportability is nanoparticle semiconductors containing ZnO or other things.

The display device 2 according to this embodiment can be modified in various manners. For instance, a display device that includes, between the pixel electrode 8 and the common electrode 12, the first charge transport layer 56 according to the example embodiment of the present disclosure, and a light-emitting layer according to the known technique in the stated order, and a method for manufacturing this display device are also encompassed in the scope of the present disclosure. For instance, a display device that includes, between the pixel electrode 8 and the common electrode 12, a light-emitting layer according to the known technique, and the second charge transport layer 58 according to the example embodiment of the present disclosure in the stated order, and a method for manufacturing this display device are also encompassed in the scope of the present disclosure.

The first charge transport layer 56 and second charge transport layer 58 according to this embodiment can be formed in a manner similar to that in the light-emitting layer 10 according to the first embodiment. It is obvious for one of ordinary skill in the art who refers to the first embodiment that there are various methods for manufacturing the display device 2 according to this embodiment. Accordingly, the description about a method for manufacturing the display device 2 according to this embodiment will be omitted.

First Charge Transport Layer

As illustrated in FIG. 14, the first red charge transport layer 56R has a first function region 56R1, and a second function region 56R2 adjacent to at least a part of the side surface of the first function region 56R1.

The first function region 56R1 includes the foregoing functional materials, and first ligands capable of coordinating with each of the functional materials. On the other hand, the second function region 56R2 includes the foregoing functional materials, and second ligands capable of coordinating with each of the functional materials. The second function region 56R2 may also include the first ligands optionally. Here, the second ligands are different from the first ligands.

Like the first red ligands 19R and second red ligands 20R in the preceding embodiment, the first ligands and second ligands in the first red charge transport layer 56R are both insulating materials with excellent voltage resistance, and their electrical properties are different from each other.

Thus, with regard to electrical conduction, the volume resistivity of the second function region 56R2 is higher than the volume resistivity of the first function region 56R1.

This volume resistivity difference increases a first current of current that flows between the pixel electrode 8 and common electrode 12 of the red light-emitting element 6R, and the difference reduces a second current of the same. Here, the first current passes through the first function region 56R1, and the second current passes through the second function region 56R2.

Hence, the emission luminance of a region corresponding to the first function region 56R1 of the red light-emitting layer 10R is lower than the emission luminance of a region corresponding to the second function region 56R2 of the red light-emitting layer 10R when the other conditions are the same.

Thus, the red light-emitting element 6R according to this embodiment exerts the effect of reducing brightness unevenness, like the red light-emitting element 6R according to the preceding embodiment. Further, the configuration and method suitable for the red light-emitting layer 10R according to the preceding embodiment are suitable for the first red charge transport layer 56R according to this embodiment as well.

As illustrated in FIG. 14, the first green charge transport layer 56G has a first function region 56G1, and a second function region 56G2 adjacent to at least a part of the side surface of the first function region 56G1.

The first function region 56G1 includes the foregoing functional materials, and first ligands capable of coordinating with each of the functional materials. On the other hand, the second function region 56G2 includes the foregoing functional materials, and second ligands capable of coordinating with each of the functional materials. The second function region 56G2 may also include the first ligands optionally. Here, the second ligands are different from the first ligands.

Like the first red ligands 19R and second red ligands 20R in the preceding embodiment, the first ligands and second ligands in the first green charge transport layer 56G are both insulating materials with excellent voltage resistance, and their electrical properties are different from each other.

Thus, the green light-emitting element 6G according to this embodiment exerts the effect of reducing brightness unevenness, like the green light-emitting element 6G according to the preceding embodiment. Further, the configuration and method suitable for the red light-emitting layer 10R according to the preceding embodiment are suitable for the first green charge transport layer 56G according to this embodiment as well.

As illustrated in FIG. 14, the first blue charge transport layer 56B has a first function region 56B1, and a second function region 56R2 adjacent to at least a part of the side surface of the first function region 56B1.

The first function region 56B1 includes the foregoing functional materials, and first ligands capable of coordinating with each of the functional materials. On the other hand, the second function region 56B2 includes the foregoing functional materials, and second ligands capable of coordinating with each of the functional materials. The second function region 56B2 may also include the first ligands optionally. Here, the second ligands are different from the first ligands.

Like the first red ligands 19R and second red ligands 20R in the preceding embodiment, the first ligands and second ligands in the first blue charge transport layer 56B are both insulating materials with excellent voltage resistance, and their electrical properties are different from each other.

Thus, the blue light-emitting element 6B according to this embodiment exerts the effect of reducing brightness unevenness, like the blue light-emitting element 6B according to the preceding embodiment. Further, the configuration and method suitable for the red light-emitting layer 10R according to the preceding embodiment are suitable for the first blue charge transport layer 56B according to this embodiment as well.

Second Charge Transport Layer

As illustrated in FIG. 14, the second red charge transport layer 58R has a first function region 58R1, and a second function region 58R2 adjacent to at least a part of the side surface of the first function region 58R1.

The first function region 58R1 includes the foregoing functional materials, and first ligands capable of coordinating with each of the functional materials. On the other hand, the second function region 58R2 includes the foregoing functional materials, and second ligands capable of coordinating with each of the functional materials. The second function region 58R2 may also include the first ligands optionally. Here, the second ligands are different from the first ligands.

Like the first red ligands 19R and second red ligands 20R in the preceding embodiment, the first ligands and second ligands in the second red charge transport layer 58R are both insulating materials with excellent voltage resistance, and their electrical properties are different from each other.

Thus, with regard to electrical conduction, the volume resistivity of the second function region 58R2 is higher than the volume resistivity of the first function region 58R1. This volume resistivity difference increases a first current of current that flows between the pixel electrode 8 and common electrode 12 of the red light-emitting element 6R, and the difference reduces a second current of the same. Here, the first current passes through the first function region 58R1, and the second current passes through the second function region 58R2. Hence, the emission luminance of a region corresponding to the first function region 58R1 of the red light-emitting layer 10R is lower than the emission luminance of a region corresponding to the second function region 58R2 of the red light-emitting layer 10R when the other conditions are the same.

Thus, the red light-emitting element 6R according to this embodiment exerts the effect of reducing brightness unevenness, like the red light-emitting element 6R according to the preceding embodiment. Further, the configuration and method suitable for the red light-emitting layer 10R according to the preceding embodiment are suitable for the second red charge transport layer 58R according to this embodiment as well.

As illustrated in FIG. 14, the second green charge transport layer 58G has a first function region 58G1, and a second function region 58G2 adjacent to at least a part of the side surface of the first function region 58G1.

The first function region 58G1 includes the foregoing functional materials, and first ligands capable of coordinating with each of the functional materials. On the other hand, the second function region 58G2 includes the foregoing functional materials, and second ligands capable of coordinating with each of the functional materials. The second function region 58G2 may also include the first ligands optionally. Here, the second ligands are different from the first ligands.

Like the first red ligands 19R and second red ligands 20R in the preceding embodiment, the first ligands and second ligands in the second green charge transport layer 58G are both insulating materials with excellent voltage resistance, and their electrical properties are different from each other.

Thus, the green light-emitting element 6G according to this embodiment exerts the effect of reducing brightness unevenness, like the green light-emitting element 6G according to the preceding embodiment. Further, the configuration and method suitable for the red light-emitting layer 10R according to the preceding embodiment are suitable for the second green charge transport layer 58G according to this embodiment as well.

As illustrated in FIG. 14, the second blue charge transport layer 58B has a first function region 58B1, and a second function region 58B2 adjacent to at least a part of the side surface of the first function region 58B1.

The first function region 58B1 includes the foregoing functional materials, and first ligands capable of coordinating with each of the functional materials. On the other hand, the second function region 58B2 includes the foregoing functional materials, and second ligands capable of coordinating with each of the functional materials. The second function region 58B2 may also include the first ligands optionally. Here, the second ligands are different from the first ligands.

Like the first red ligands 19R and second red ligands 20R in the preceding embodiment, the first ligands and second ligands in the second blue charge transport layer 58B are both insulating materials with excellent voltage resistance, and their electrical properties are different from each other.

Thus, the blue light-emitting element 6B according to this embodiment exerts the effect of reducing brightness unevenness, like the blue light-emitting element 6B according to the preceding embodiment. Further, the configuration and method suitable for the red light-emitting layer 10R according to the preceding embodiment are suitable for the second blue charge transport layer 58B according to this embodiment as well.

The present disclosure is not limited to the foregoing embodiments. Various modifications can be devised within the scope of the claims. An embodiment that is obtained in combination, as appropriate, with the technical means disclosed in the respective embodiments is also encompassed in the technical scope of the present disclosure. Furthermore, combining the technical means disclosed in the respective embodiments can form a new technical feature.

The invention claimed is:

1. A light-emitting element comprising in a stated order: a first electrode; a function layer; and a second electrode, wherein the function layer has a first function region including a functional material and a first ligand, and a second function region including the functional material and a second ligand different from the first ligand, the second function region being adjacent to at least a part of a side surface of the first function region, and a volume resistivity of the second function region is higher than a volume resistivity of the first function region.

2. The light-emitting element according to claim 1, wherein the volume resistivity of the second function region is higher than the volume resistivity of the first function region by 2 to 1000 times inclusive.

3. The light-emitting element according to claim 1, wherein the first ligand is a ligand containing, as a coordinating functional group, at least one from the group consisting of a thiol group, an amino group, a carboxyl group, a phosphon group, a phosphine group, a phosphine oxide group, and a hydroxyl group.

4. The light-emitting element according to claim 1, wherein the first function region corresponds to a middle of a main emission region, and the second function region corresponds to a peripheral region surrounding the middle of the main emission region.

5. The light-emitting element according to claim 1, wherein the function layer includes a hole transport layer, and the functional material in the hole transport layer includes a nanoparticle having hole transportability.

6. The light-emitting element according to claim 1, wherein the function layer includes an electron transport layer, and the functional material in the electron transport layer includes a nanoparticle having electron transportability.

7. The light-emitting element according to claim 1, wherein the function layer includes a light-emitting layer, and the functional material in the light-emitting layer includes a nanoparticle that emits light in response to an exciton that is generated by electron-and-hole recombination.

8. A display device comprising at least one light-emitting element according to claim 1.

9. A display device comprising:

at least one red light-emitting element configured to emit red light;

at least one green light-emitting element configured to emit green light; and at least one blue light-emitting element configured to emit blue light, which are, respectively, the light-emitting element according to claim 7, wherein the second ligands included in the light-emitting layers of the at least one red light-emitting element, the at least one green light-emitting element, and at least one blue light-emitting element are different from each other.

10. A light-emitting element comprising in a stated order: a first electrode; a function layer; and a second electrode, wherein the function layer has a first function region including a functional material and a first ligand, and a second function region including the functional material and a second ligand different from the first ligand, the second function region being adjacent to at least a part of a side surface of the first function region, and a volume resistivity of a film composed of only the second ligand is higher than a volume resistivity of a film composed of only the first ligand.

11. The light-emitting element according to claim 10, wherein the volume resistivity of the film composed of only the second ligand is higher than the volume resistivity of the film composed of only the first ligand by 2 to 1000 times inclusive.

12. A light-emitting element comprising in a stated order: a first electrode; a function layer; and a second electrode, wherein the function layer has a first function region including a functional material and a first ligand, and a second function region including the functional material and a second ligand different from the first ligand, the second function region being adjacent to at least a part of a side surface of the first function region, and carbon contained in the second ligand outnumbers carbon contained in the first ligand by five or more.

13. The light-emitting element according to claim 12, wherein the second ligand contains 10 to 30 carbon atoms inclusive.

14. The light-emitting element according to claim 12, wherein the second ligand includes a long-chain ligand containing 10 or more carbon atoms.

15. The light-emitting element according to claim 14, wherein the long-chain ligand has a main-chain skeleton containing 10 to 30 carbon atoms inclusive.

16. The light-emitting element according to claim 14, wherein the long-chain ligand has a side-chain skeleton containing 2 to 20 carbon atoms inclusive.

17. The light-emitting element according to claim 12, wherein the second ligand includes a polymer ligand containing a polymer.

18. The light-emitting element according to claim 17, wherein the polymer ligand has a molecular weight of 10000 or greater.

19. The light-emitting element according to claim 12, wherein the second ligand includes an oligomer ligand containing an oligomer.

20. The light-emitting element according to claim 12, wherein the oligomer ligand has a molecular weight of 1000 or greater and less than 10000.

* * * * *